(12) United States Patent
Dube et al.

(10) Patent No.: US 11,294,436 B2
(45) Date of Patent: Apr. 5, 2022

(54) MODULAR REMOVABLE AIR MOVER FOR DUAL ACCESS

(71) Applicant: Dell Products L.P., Hopkinton, MA (US)

(72) Inventors: Shawn Joel Dube, Austin, TX (US); Robert Warren Johnson, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 34 days.

(21) Appl. No.: 16/777,836

(22) Filed: Jan. 30, 2020

(65) Prior Publication Data

US 2021/0240237 A1    Aug. 5, 2021

(51) Int. Cl.
 G06F 1/20    (2006.01)
 H05K 7/20    (2006.01)
 G06F 1/18    (2006.01)

(52) U.S. Cl.
 CPC ............... *G06F 1/20* (2013.01); *G06F 1/181* (2013.01); *H05K 7/20136* (2013.01)

(58) Field of Classification Search
 CPC . G06F 1/20; G06F 1/187; G06F 1/181; G06F 1/206; H05K 7/20736; H05K 7/1489; H05K 7/1487; H05K 7/20836; H05K 7/20727; H05K 7/20772; H05K 7/20709; H05K 7/20; H05K 7/20172; H05K 7/20136; H05K 7/20209
 USPC ............... 361/695, 679.48, 690, 679.49, 694, 361/679.46, 689, 679.31, 715, 688, 728, 361/731; 165/104.33, 80.2, 80.3; 454/184
 See application file for complete search history.

(56) References Cited

U.S. PATENT DOCUMENTS

| | | | | | |
|---|---|---|---|---|---|
| 5,822,184 | A | * | 10/1998 | Rabinovitz | G11B 33/128 361/679.31 |
| 8,873,236 | B1 | * | 10/2014 | Tamarkin | H05K 7/20172 361/695 |
| 2004/0005855 | A1 | * | 1/2004 | Giraldo | H05K 7/20172 454/184 |
| 2005/0105269 | A1 | * | 5/2005 | Chen | H05K 7/20172 361/695 |
| 2007/0205010 | A1 | * | 9/2007 | Chen | G11B 33/12 174/50 |

(Continued)

OTHER PUBLICATIONS

Dell EMC; "PowerEdge MX7000 Enclosure—Installation and Service Manual"; Dell Inc., Sep. 17, 2019 (https://www.dell.com/support/manuals/us/en/04/poweredge-mx7000/pemx7000_ism_pub/).

(Continued)

*Primary Examiner* — Mandeep S Buttar
(74) *Attorney, Agent, or Firm* — Chamberlain, Hrdlicka, White, Williams & Aughtry

(57) ABSTRACT

An equipment rack that includes a modular compute chassis, a modular processing unit located in the modular compute chassis and where the modular processing unit is configured to remove from the front of the modular compute chassis in a frontward direction, relative to the front side of the modular compute chassis, and an air mover unit located in the modular processing unit and where the air mover unit is configured to remove from a rear side of the modular processing unit in a rearward direction, relative to the front side of modular compute chassis.

11 Claims, 5 Drawing Sheets

(56) References Cited

U.S. PATENT DOCUMENTS

2010/0110632 A1* 5/2010 Rose .................. H05K 7/20727
                                                         361/695
2017/0049009 A1* 2/2017 Steinke .............. H05K 7/20772

OTHER PUBLICATIONS

Dell; "PowerEdge C8000—Hardware Owner's Manual"; Dell Inc., Apr. 14, 2014 (https://www.dell.com/support/home/us/en/19/product-support/product/poweredge-c8000/docs).

* cited by examiner

MODULAR REMOVABLE AIR MOVER FOR DUAL ACCESS

BACKGROUND

Devices and/or components of devices are often capable of performing certain functionalities that other devices and/or components are not configured to perform and/or are not capable of performing. In such scenarios, it may be desirable to adapt one or more systems to enhance the functionalities of devices and/or components that cannot perform the one or more functionalities.

SUMMARY

In general, in one aspect, the invention relates to an equipment rack that includes a modular compute chassis, a modular processing unit located in the modular compute chassis and where the modular processing unit is configured to remove from the front of the modular compute chassis in a frontward direction, relative to the front side of the modular compute chassis, and an air mover unit located in the modular processing unit and where the air mover unit is configured to remove from a rear side of the modular processing unit in a rearward direction, relative to the front side of modular compute chassis.

In general, in one aspect, the invention relates to a method for removing an air mover unit, where the method includes gaining access to a rear side of a modular processing unit and where the modular processing unit is located in a modular compute chassis, disengaging the air mover unit from the modular processing unit, and translating the air mover unit out of the modular processing unit and where the air mover unit is configured to remove from the rear side of the modular processing unit in a rearward direction, relative to a front side of modular compute chassis.

Other aspects of the invention will be apparent from the following description and the appended claims.

DETAILED DESCRIPTION

Figure 1:
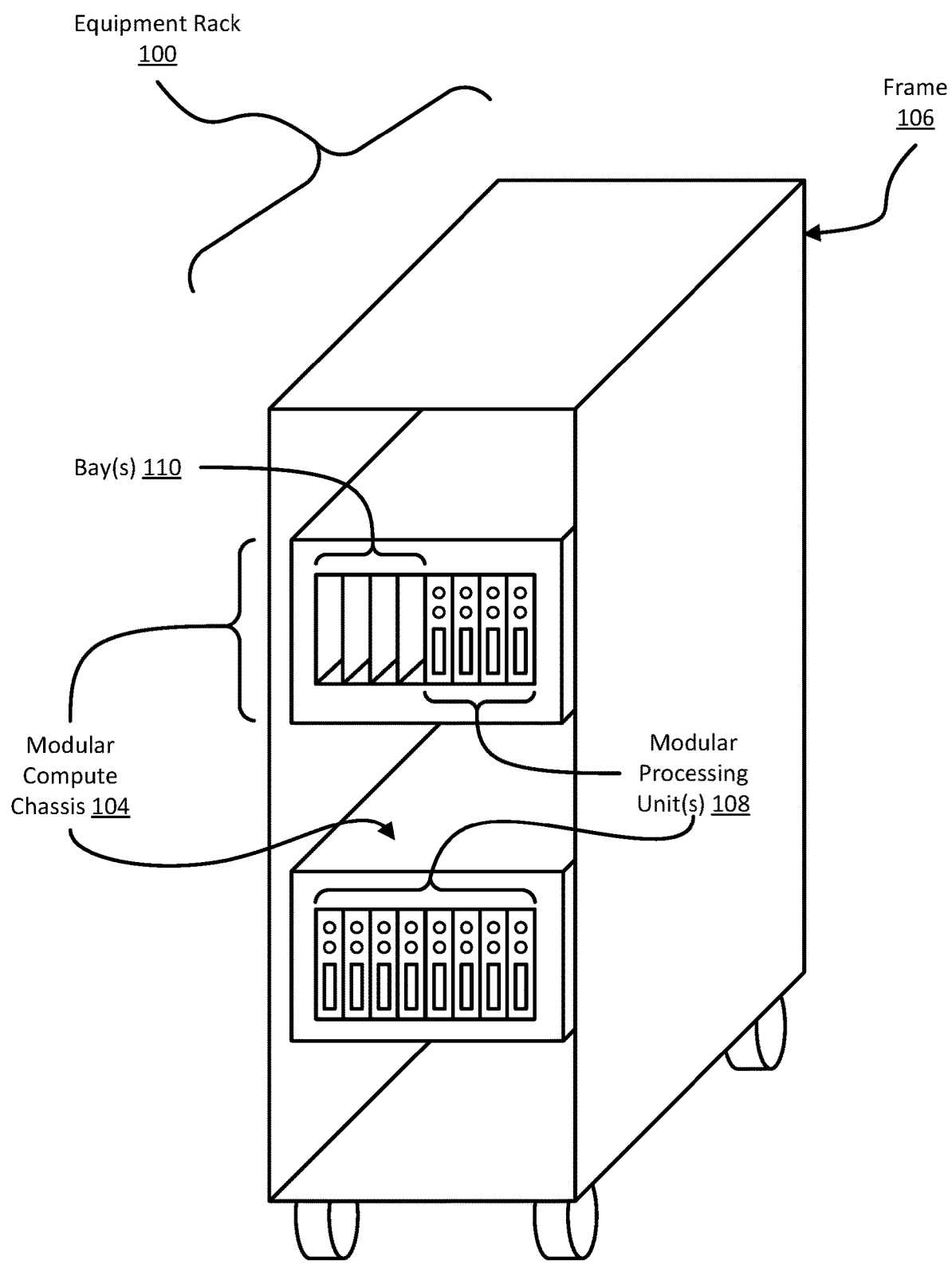
FIG. 1 shows an example of an equipment rack, in accordance with one or more embodiments of the invention.

Specific embodiments will now be described with reference to the accompanying figures. In the following description, numerous details are set forth as examples of the invention. One of ordinary skill in the art, having the benefit of this detailed description, would appreciate that one or more embodiments of the present invention may be practiced without these specific details and that numerous variations or modifications may be possible without departing from the scope of the invention. Certain details known to those of ordinary skill in the art may be omitted to avoid obscuring the description.

In the following description of the figures, any component described with regard to a figure, in various embodiments of the invention, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments of the invention, any description of any component of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the term 'operatively connected', or 'operative connection', means that there exists between elements/components/devices a direct or indirect connection that allows the elements to interact with one another in some way (e.g., via the exchange of information). For example, the phrase 'operatively connected' may refer to any direct (e.g., wired or wireless connection directly between two devices) or indirect (e.g., wired and/or wireless connections between any number of devices connecting the operatively connected devices) connection.

In general, embodiments of the invention relate to systems and methods for providing ways to install, remove, service, and/or replace one or more modular components of a system. Specifically, one embodiment of the invention, relates to a method for directly accessing a modular component that is an actively operating component of multiple larger and nested systems. For example, one embodiment of the invention provides a system and method for directly removing an air mover unit, which is component of a modular processing unit, modular compute chassis, and equipment rack. Yet, the air mover unit is directly installable, removable, replaceable, etc. without deconstructing one or more layer(s) of the larger system(s) to which the air mover unit is a part.

Alternatively, another embodiment of the invention provides for a system and method where only one larger system is removed to gain access to the modular component (in the event that direct access to the modular component is not available). Specifically, one embodiment of the invention, relates to a method for removing the modular processing unit (in which the air mover unit is directly disposed) to gain access to the air mover unit.

The invention may provide one or more advantages. In one embodiment of the invention, modular components may be "hot swappable" whereby the larger system(s) in which the component operates remain powered and operating throughout the component's installation, removal, and/or replacement.

Another advantage, in one or more embodiments of the invention, is that modular components may be relocated to the rear of a larger system, without sacrificing accessibility of those modular components. Further, locating modular components on the rear side of a system allows for the other uses of the previously occupied space on the front side of the system (e.g., more frequently accessed interfaces, information display, etc.). Additionally, if an air mover (e.g., fan) is relocated to the rear side of a system, then that air mover may provide auxiliary cooling to other devices that benefit from forced convection. The invention is not limited to the aforementioned advantages.

FIG. 1 shows an example diagram of an equipment rack, in accordance with one or more embodiments of the invention. The equipment rack (100) may include a frame (e.g., frame (106)) and one or more modular compute chassis (e.g., modular compute chassis (104)). The components of the example equipment rack (100) may include mounting capabilities to mount one or more modular compute chassis (104). By doing so, devices may be stacked in a high-density computing environment.

In one or more embodiments of the invention, the equipment rack (100) is a physical structure. The equipment rack (100) may include a frame (e.g., frame (106)) that may be adapted to facilitate storage of one or more modular compute chassis (104) in a high-density computing environment. The high-density computing environment may be, for example, a data center or another type of location where one or more modular compute chassis (104) are located.

The frame (106) may be constructed using any number of suitable materials. For example, portions of the frame (106) may be implemented using metals (e.g., steel, aluminum, etc.). In another example, portions of the frame (106) may be implemented using polymers (e.g., polyamides, polycarbonates, polyester, polyethylene, polypropylene, polystyrene, polyurethanes, polyvinyl chloride, etc.). As another example, portions of the frame (106) may be implemented using rubber (e.g., latex, styrene-butadiene rubbers, etc.). One of ordinary skill in the art, having the benefit of this detailed description, would appreciate that the frame (106) may be implemented using any quantity and combination of suitable materials without departing from the scope of this invention.

To facilitate mounting of one or more modular compute chassis (104), the frame (106) may include any number of structural members (e.g., beams, brackets, bars, etc.) and any number of mechanical mounting points (e.g., holes, threaded portions, etc.) disposed on the structural members to facilitate storage of a modular compute chassis (104). Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting one or more modular compute chassis (104).

When all, or a portion, of the structural members are mechanically connected to each other, the mechanical mounting points may be disposed at predetermined locations. The predetermined locations may correspond to similar predetermined locations on a modular compute chassis (104) where mechanical mounting elements, complementary to the mechanical mounting points, are disposed. By doing so, the frame (106) may be adapted to position a modular compute chassis (104) in locations and/or orientations suitable for a high-density computing environment, or another environment in which a modular compute chassis (104) may be located. The mechanical mounting points may be any type of physical structure for attaching (permanently or reversibly) a modular compute chassis (104) to the frame (106). There may be any number of mechanical mounting points to facilitate the attachment of any number of corresponding modular compute chassis (104).

To facilitate attachment of a modular compute chassis (104) to the frame, the modular compute chassis (104) may include any number of mechanical mounting elements. The mechanical mounting elements may be located at predetermined locations. For example, a mechanical mounting element may be a rail disposed on a side of a modular compute chassis (104). The location of the rail may correspond to a position on the frame (106) where a rail guide (i.e., a complementary mechanical mounting point) is disposed. The rail and the rail guide may facilitate attachment of a modular compute chassis (104) to the frame (106) which, in turn, positions and orients a modular compute chassis (104) relative to the frame (106) and equipment rack (100), generally.

In one or more embodiments of the invention, a modular compute chassis (e.g., modular compute chassis (104)) is a physical device that houses one or more components (e.g., modular processing unit(s) (104)) in one or more bay(s) (e.g., bays (110)). In one embodiment of the invention, a modular compute chassis (104) may have different configurations and/or uses within the equipment rack (100). In one or more embodiments of the invention, an equipment rack (100) may include any number and combination of modular compute chassis (104) adapted for any number of different uses and/or sizes without departing from the scope of the invention. By way of example, modular compute chassis (104) may execute a server for hosting a website, or alternatively, modular compute chassis (104) may host a media server, which stores media files. Further, one modular compute chassis (104) may be of a larger physical size than another modular compute chassis (104) and, consequently, may be capable of housing more and/or larger modular processing units (e.g., modular processing unit(s) (108)) therein. More details regarding the description of a modular compute chassis (104) and a modular processing unit(s) (108) is provided in the description of FIGS. 2-4.

In one or more embodiments of the invention, a modular compute chassis (104) extends from a front side (i.e., the side forwardly depicted in FIG. 1) of the equipment rack (100) to a rear side (not shown) of the equipment rack (100). Thus, in one embodiment of the invention, a front of a modular compute chassis (104) may be accessible from a front of an equipment rack (100) while a rear side of a modular compute chassis (104) may be accessible from a rear side of the equipment rack (100).

While the example equipment rack (100) of FIG. 1 has been illustrated as including a limited number of components, an equipment rack (100) in accordance with embodiments of the invention may include any number of frames, modular compute chassis, modular processing units, and/or other components without departing from the invention. For example, any number of frames (and/or other types of physical devices for positioning/orienting devices) may be used in a high density computing environment to facilitate the placement and/or orientation of any number of modular compute chassis and/or modular processing units. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame may be used in conjunction with any number and/or type of other device without departing from the invention.

Figure 2:
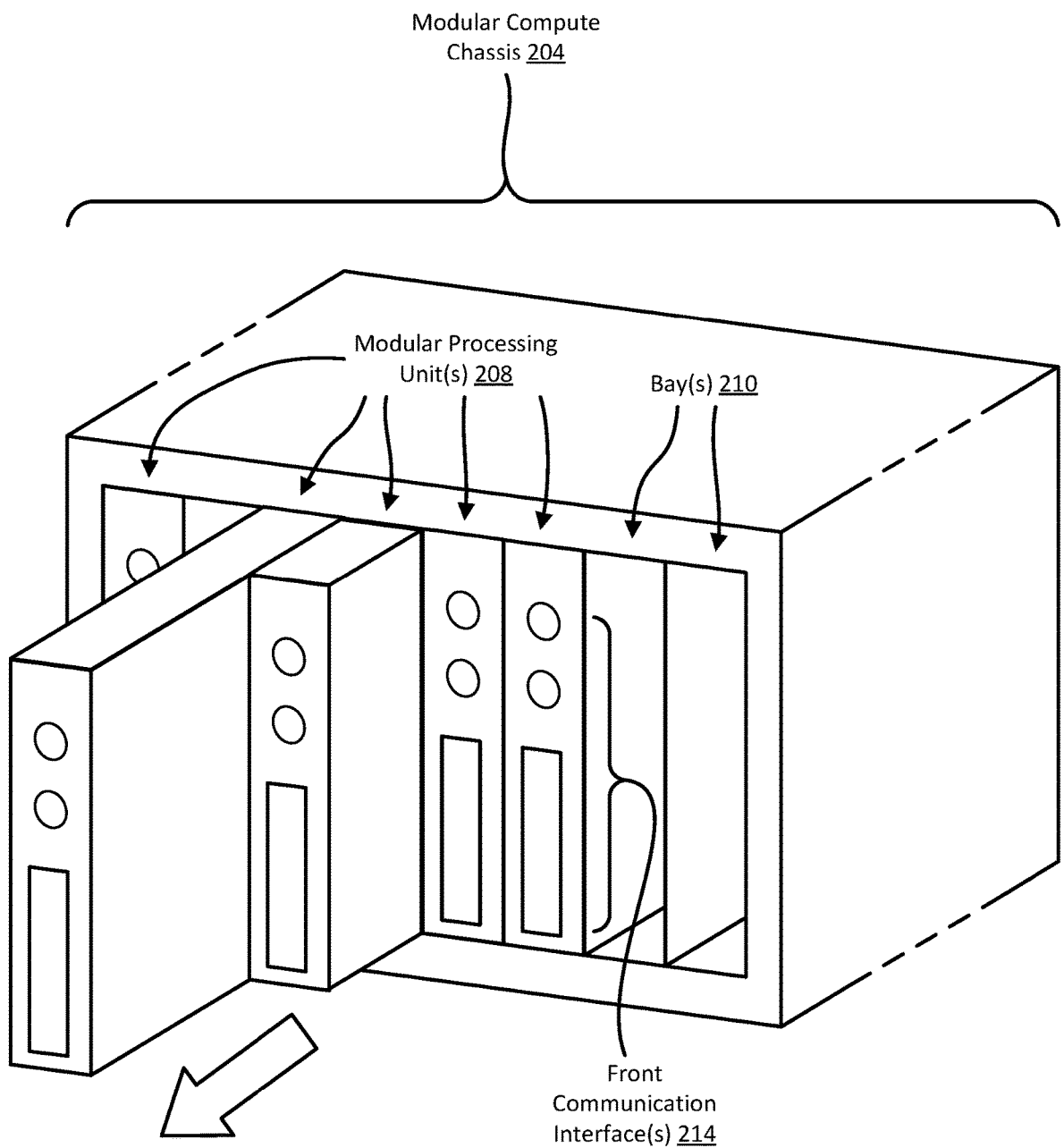
FIG. 2 shows an example of a front side of modular compute chassis, in accordance with one or more embodiments of the invention.

FIG. 2 shows an example of a front side of modular compute chassis, in accordance with one or more embodiments of the invention. Specifically, as shown in FIG. 2, the front side of a modular compute chassis (e.g., modular compute chassis (204)) is depicted. In one embodiment of the invention, the front side of a modular compute chassis (204) allows for access to one or more modular processing unit(s) (208) and one or more front communication interface(s) (214) disposed thereon. In one embodiment of the invention, the front of a modular compute chassis (204) is the side of the modular compute chassis (204) accessible from a "front" of an equipment rack (e.g., the front facing side depicted in FIG. 1).

In one or more embodiments of the invention, a modular compute chassis (e.g., modular compute chassis (204)) is a mechanical device that is adapted to (i) house one or more modular processing unit(s) (208), (ii) provide electrical operative connection(s) to one or more modular processing unit(s) (208) (e.g., for electrical power and/or communications), and/or (iii) provide shared resources to one or more modular processing unit(s) (208).

In one embodiment of the invention, a casing forms the exterior structure of the modular compute chassis (204). The casing of the modular compute chassis (204) may be constructed using any number of suitable materials. For example, portions of the casing may be implemented using metals (e.g., steel, aluminum, etc.). In another example, portions of the casing may be implemented using polymers (e.g., Polyamides, polycarbonates, polyester, polyethylene, polypropylene, polystyrene, polyurethanes, etc.). In a still further example, portions of the casing may be implemented using rubber (e.g., latex, styrene-butadiene rubbers, etc.) The casing may be implemented using any quantity and combination of suitable materials without departing from the invention.

To house the one or more modular processing unit(s) (208), the casing may include one or more bay(s) (e.g., bay(s) (210)). One or more bay(s) (210) may facilitate disposing of the one or more modular processing unit(s) (208) (and/or other devices) within a modular compute chassis (204). For example, the bay(s) (210) may have a shape or other characteristic(s) that facilitates disposing of the one or more modular processing unit(s) (208) (e.g., a rectangular void capable of housing one or more modular processing unit(s) (208) and/or other devices).

In one or more embodiments of the invention, a modular processing unit (208) may translate (e.g., slide) into an unoccupied bay (210) (e.g., the two right-most bays of FIG. 2) of a modular compute chassis (204). In one embodiment of the invention, a modular processing unit (208) is constructed to have a physical size that is slightly smaller than the cavity created by bay (210) thereby allowing for the insertion of the modular processing unit (208) into the modular compute chassis (204). Further, in one embodiment of the invention, a modular processing unit (208) and a modular compute chassis (204) may each have corresponding communication interfaces (not shown) to accommodate the transmission of electrical power and/or electronic communications.

In one embodiment of the invention, the modular compute chassis (204) and/or modular processing unit (208) may provide one or more mechanical attachment devices (not shown) to affix a modular processing unit (208) into a bay (210). Further, once one or more mechanical attachment device(s) are engaged, a modular processing unit (208) may not move independently of the modular compute chassis (204) without first disengaging those one or more mechanical attachment device(s) (to allow for the translation of a modular processing unit (208) out of and away from the modular compute chassis (204)).

For example, a modular processing unit (208) may attach to a modular compute chassis (204) via mechanical attaching means (e.g., latches, clip(s), sliding rails) that utilize the elasticity and/or shape of the attaching means to removably attach the two devices (208, 204). As another example, a modular processing unit (208) may attach to a modular compute chassis (204) via rigid fasteners (e.g., screws, nails, pins, etc.) that traverse one or more aligned mechanical mounting points of the modular processing unit (208) and modular compute chassis (204). One of ordinary skill in the art, having the benefit of this detailed description, would appreciate that any fixing means suitable to attach two physical objects may be utilized to affix a modular processing unit (208) to a modular compute chassis (204).

In one embodiment of the invention, a modular compute chassis (204) provides electrical power (e.g., power) to one or more modular processing unit(s) (208) via one or more conductive operative connection(s) (e.g., metallic contacts and/or wire(s) terminated with a plug and socket). In turn, in one embodiment of the invention, one or more modular processing unit(s) (208) provide power to one or more components of the modular processing unit (e.g., an air mover unit (not shown)). The modular compute chassis (204) may be provided power from an equipment rack (not shown) or via some other source.

In one embodiment of the invention, a modular processing unit (e.g., modular processing unit(s) (208)) is physical structure that includes an empty volume suitable to store one or more other devices (defined above) and/or components of other devices. In one embodiment of the invention, one or more front communication interface(s) provides capabilities to interface the modular processing unit (208) with one or more devices. More details regarding the description of a modular processing unit (e.g., modular processing unit(s) (208)) is provided in the description of FIG. 3.

While FIG. 2 shows an example of a front side of modular compute chassis, other configurations may be used without departing from the scope of the invention. For example, although the modular compute chassis is shown with eight equally sized bays and five equally sized modular processing units, a modular compute chassis may include any number of bays and/or bays of varying size to accommodate modular processing units of corresponding sizes. Further, while FIG. 2 shows a horizontal array of vertical modular processing units and bays, a modular compute chassis may be implemented that vertically stacks horizontal modular processing units and bays. Accordingly, embodiments disclosed herein should not be limited to the configuration of devices and/or components shown in FIG. 2.

Figure 3:
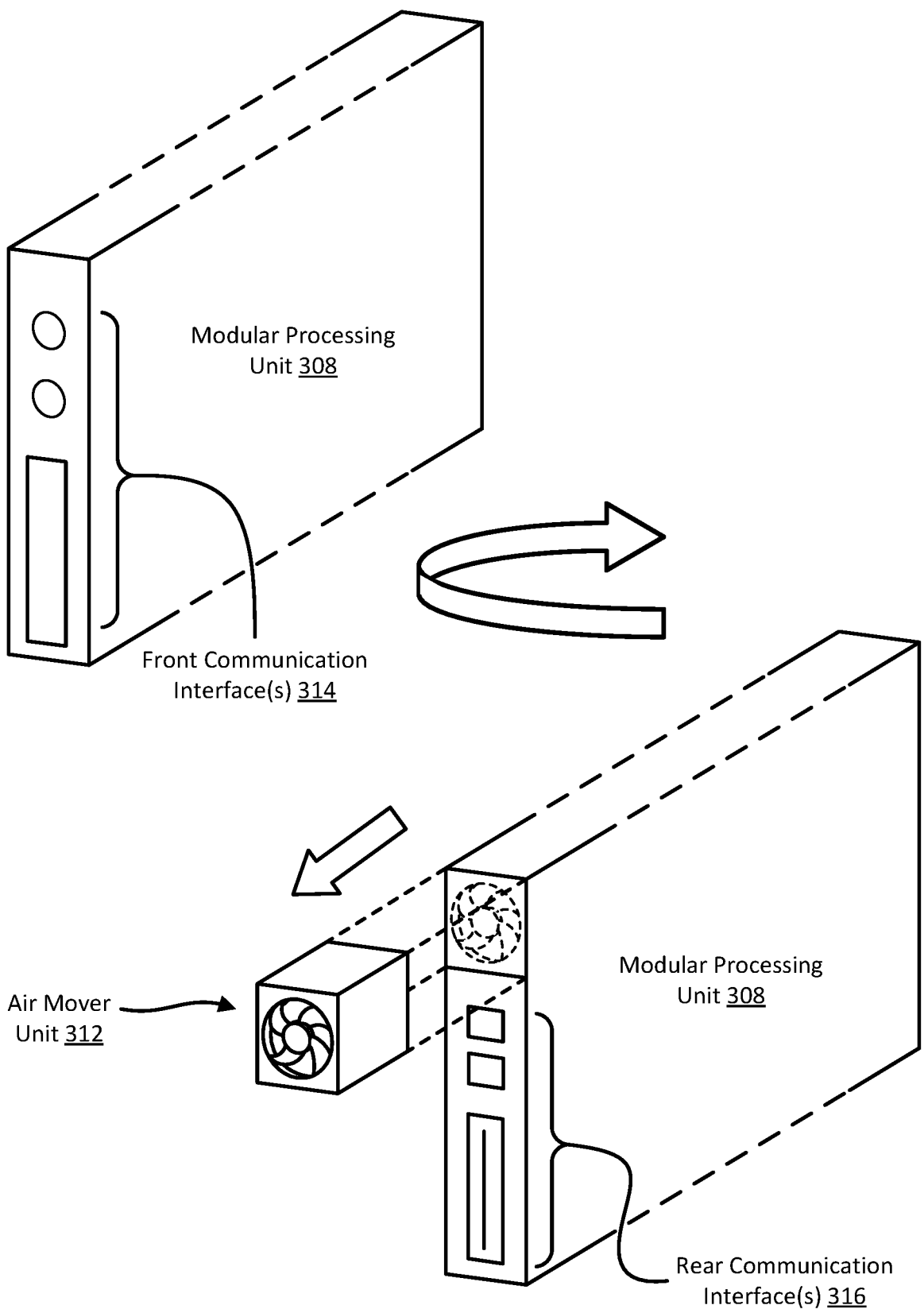
FIG. 3 shows a diagram of a modular processing unit, in accordance with one or more embodiments of the invention.

FIG. 3 shows a diagram of a modular processing unit, in accordance with one or more embodiments of the invention. In one embodiment of the invention, a modular processing unit (e.g., modular processing unit (308)) includes front communication interface(s) (314), rear communication interface(s) (316), and an air mover unit (312) to provide thermal management.

In one embodiment of the invention, a modular processing unit (e.g., modular processing unit (308)) is physical structure that includes an empty volume suitable to store one or more other devices (defined above) and/or components of other devices. Non-limiting examples of one or more components include integrated circuits, processors, integrated circuit storage devices (e.g., solid-state drive (SSD), M.2, Non-Volatile Memory Express (NVMe), flash memory, random access memory (RAM), dynamic RAM (DRAM), resistive RAM (ReRAM), etc.), and/or other electronic parts.

In one or more embodiments of the invention, a communication interface (e.g., front communication interface(s) (314), rear communication interface(s) (316)) is a hardware component that provides capabilities to interface the modular processing unit (308) with one or more devices (e.g., a client, another modular processing unit (not shown), a modular compute chassis (not shown)) and allow for the transmission and receipt of data with those devices. A communication interface (314, 316) may communicate via any suitable form of wired interface (e.g., Ethernet, fiber optic, serial communication etc.) and/or wireless interface and utilize one or more protocols for the transmission and receipt of data (e.g., Transmission Control Protocol (TCP)/Internet Protocol (IP), Remote Direct Memory Access (RDMA), Institute of Electrical and Electronics Engineers (IEEE) 801.11, etc.).

In one embodiment of the invention, a rear communication interface (e.g., rear communication interface(s) (316)) may provide a method for operatively connecting to a modular compute chassis (not shown). In one embodiment of the invention, when a modular processing unit (308) is inserted into a bay of a modular compute chassis, one or more rear communication interface(s) (316) may physically operatively connect to one or more corresponding communication interfaces (e.g., shared resource interface(s)) disposed on the modular compute chassis. More details regarding the description of shared resource interface(s) is provided in the description of FIG. 4.

In one embodiment of the invention, one or more modular processing unit(s) (308) provide thermal management services to components and/or other devices of the modular processing unit (308). A modular processing unit (308) may facilitate the flow of gas proximate to the one or more components and/or other devices (e.g., via an air mover unit (312)). By doing so, the thermal state (i.e., temperature) of the aforementioned devices may be regulated (i.e., maintained within a preferred temperature range).

In one embodiment of the invention, a modular processing unit (308) provides thermal management services to one or more electronic component(s) (not shown) within the modular processing unit. A modular processing unit (308) may facilitate the flow of gas proximate to the one or more electronic component(s) and/or other devices by including one or more vents that allow a gas from a first side (e.g., front) of a modular processing unit (308) to flow into, through, and out a second side (e.g., rear) of the modular processing unit (308). The gas, flowing through the modular processing unit (308), may be at a different temperature than the components and/or other devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices.

In one or more embodiments of the invention, an air mover (e.g., air mover unit (312)) is a mechanical device used to control, generate, or otherwise manage the flow of gaseous matter within a volume. For example, an air mover unit (312) may be used to generate a flow of surrounding gaseous matter through the volume of a device (e.g., modular processing unit (308)) that is unoccupied by solid matter. That is, an air mover unit (312) can direct and/or generate the flow of gaseous matter across one or more surface(s) of solid matter that is surrounded by that gaseous matter. Lastly, an air mover unit (312) may force gaseous matter across the surface of solid matter by either sucking-in or blowing-out that gaseous matter. One of ordinary skill in the art, having the benefit of this detailed description, would appreciate the basic principles and operation of an air mover unit (e.g., air mover unit (312)).

Accordingly, in one embodiment of the invention, an air mover unit (312) may be used to force the convection (i.e., thermal exchange via surrounding fluidic matter) on one or more devices thereby expediting the rate at which that device is brought to an equilibrium temperature. One of ordinary skill in the art, having the benefit of this detailed description, would appreciate the process of expediting thermal exchange via the use of an air mover unit (e.g., air mover unit (312)).

In one embodiment of the invention, an air mover unit (312) may include an air mover and one or more other physical component(s) that mount the air mover unit (312) to another physical device (e.g., modular processing unit (308)). Alternatively, an air mover unit (312) may refer exclusively to an air mover (i.e., an air mover without additional physical components). Examples of an air mover unit (312) (and/or the air mover thereof) include a fan, a valve to control flow between two gaseous volumes of differing pressure, and/or any other means for controlling, generating, or otherwise managing the flow of gaseous matter. As shown in FIG. 3, air mover unit (312) is depicted to include a fan that includes blades. Further, although referred to as an "air mover unit" (or "air mover") herein, an air mover may be used to control, generate, or otherwise manage any gaseous matter (not just "air").

In one embodiment of the invention, an air mover unit (312) uses electrical power (e.g., "power") to operate one or more components to manage the flow of gaseous matter. For example, a fan may use a direct current (DC) motor operatively connected to the blades of the fan to generate a rotational motion. Similarly, a valve may utilize and power a solenoid to control gaseous flow between two volumes of differing pressure. In one embodiment of the invention, power may be provided to the air mover unit (312) via a conductive operative connection (not shown) (via e.g., metallic contacts and/or wire(s) terminated with a plug and socket) with the modular processing unit (308). Alternatively, power may be provided to the air mover unit (312) via a conductive operative connection with the modular compute chassis (not shown).

In one or more embodiments of the invention, an air mover unit (312) may be designed and/or designed to operate such that the air mover unit (312) can only control, generate, or otherwise manage the flow of gaseous matter in one direction. For example, the blades of a fan may be contoured to more efficiently 'push' gaseous matter when the blades are rotated in a particular direction, thereby forcing gaseous flow in that one direction. That is, although it may be possible to 'reverse' the direction of the fan by reversing the polarity of the DC motor that rotates the blades, those blades (when spun in the opposite direction) would not be as efficient at controlling the flow of gaseous matter.

In one or more embodiments of the invention, an air mover unit (312) may translate (e.g., slide) into an unoccupied cavity on the rear side of a modular processing unit (308). In one embodiment of the invention, an air mover unit (312) is constructed to have a physical size that is slightly smaller than the unoccupied cavity, thereby allowing for the insertion of the air mover unit (312) into the modular processing unit (308). Further, in one embodiment of the invention, an air mover unit (312) and a modular processing unit (308) may each have corresponding communication interfaces (not shown) to accommodate the transmission of electrical power and/or electronic communications.

In one embodiment of the invention, the modular processing unit (308) and/or air mover unit (312) may provide one or more mechanical attachment devices (not shown) to affix the air mover unit (312) to the modular processing unit (308). Further, once one or more mechanical attachment device(s) are engaged, an air mover unit (312) may not move independently of the modular processing unit (308) without first disengaging those one or more mechanical attachment device(s) (to allow for the translation of an air mover unit (312) out of and away from the modular processing unit (308)).

For example, an air mover unit (312) may attach to a modular processing unit (308) via mechanical attaching means (e.g., latches, clip(s), sliding rails) that utilize the elasticity and/or shape of the attaching means to removably attach the two devices (312, 308). As another example, an air mover unit (312) may attach to a modular processing unit (308) via rigid fasteners (e.g., screws, nails, pins, etc.) that traverse one or more aligned mechanical mounting points of the air mover unit (312) and modular processing unit (308). One of ordinary skill in the art, having the benefit of this detailed description, would appreciate that any fixing means suitable to attach two physical objects may be utilized to affix an air mover unit (312) to a modular processing unit (308).

As shown in FIG. 3, an air mover unit (e.g., air mover unit (312)) may be removed from a modular processing unit (e.g., modular processing unit (308)). In the embodiment depicted in FIG. 3, the air mover unit (312) is located on the rear side of the modular processing unit (308), and therefore removal of the air mover unit (312) requires access to the rear side of the modular processing unit (308). Thus, in one embodiment of the invention, a modular processing unit (308) may be removed from a modular compute chassis (e.g., via translation as described in the discussion of FIG. 2) so that the rear of the modular processing unit (308) may be accessed and an air mover unit (312) may be installed, removed, serviced, and/or replaced.

In one embodiment of the invention, installing, removing, servicing, and/or replacing an air mover unit (312) while the respective modular processing unit (308) is disconnected from the modular compute chassis (304) may be referred to as "cold swapping" that air mover unit (312). Alternatively, in one embodiment of the invention, where other devices (e.g., other modular processing unit(s) (308)) are configured to allow for the temporary removal of a modular processing unit (308) (e.g., by assuming operations and other functions), installing, removing, servicing, and/or replacing an air mover unit (312)—while the respective modular processing unit (308) is disconnected from the modular compute chassis (304)—may be referred to as "warm swapping" that air mover unit (312).

While FIG. 3 shows a diagram of a modular processing unit, other configurations may be used without departing from the scope of the invention. Accordingly, embodiments disclosed herein should not be limited to the configuration of devices and/or components shown in FIG. 3.

Figure 4:
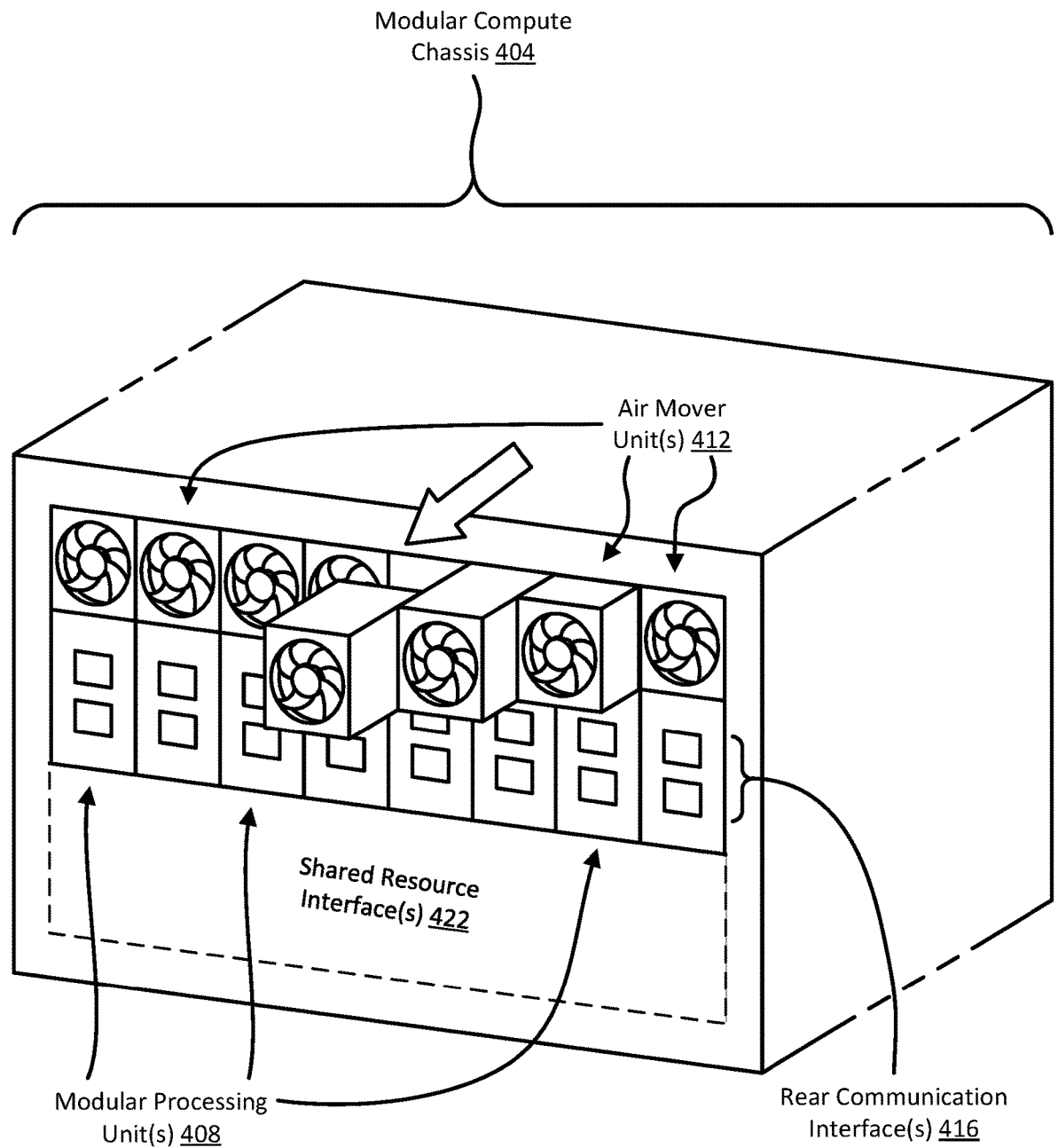
FIG. 4 shows an example of a rear side modular compute chassis, in accordance with one or more embodiments of the invention.

FIG. 4 shows an example of a rear side modular compute chassis, in accordance with one or more embodiments of the invention. In one or more embodiments of the invention, a modular compute chassis (e.g., modular compute chassis (404)) includes shared resource interface(s) (e.g., shared resource interface(s) (422)) and one or more modular processing unit(s) (e.g., modular processing unit(s) (408)) in one or more bays. Further, a modular processing unit(s) (e.g., modular processing unit(s) (408)) may include one or more air mover unit(s) (e.g., air mover unit(s) (412)) and rear communication interface(s) (e.g., rear communication interface(s) (416)).

In one or more embodiments of the invention, a shared resource interface (e.g., shared resource interface(s) (422)) is one or more communication interface(s) (described in the discussion of FIG. 3) to allow for an operative connection with one or more modular processing unit(s) (408). In one embodiment of the invention, a shared resource interface (422) is a physical operative connection that provides electrical power and/or communications between two or more devices (e.g., a modular compute chassis (404) and a modular processing unit (408)). In one embodiment of the invention, shared resource interface(s) (422) are physically aligned with one or more bay(s), in the interior of the modular compute chassis (404), such that when a modular processing unit (408) is inserted into a bay, a shared resource interface (422) will align and physically contact a corresponding communication interface on the rear side of the modular processing unit (408).

In one or more embodiments of the invention, shared resource interface(s) (422) may provide an interface for a modular processing unit (408) to access shared resource(s) (not shown) of the modular compute chassis (404). For example, one or more modular processing unit(s) (408) of the modular compute chassis (404) may lack one or more components required to operate and/or may co-utilize shared resources (to optimize usage of those shared resources). Accordingly, a modular compute chassis (404) may include one or more shared resource(s) and provide access to those shared resource(s) via one or more shared resource interface(s) (422). Non-limiting examples of a shared resource include a power supply, a storage device (hard disc drive, solid state drive), memory, processors, and/or other components that may be shared among one or more modular processing unit(s) (408).

Similar to the description of the modular processing unit (408) as discussed in FIG. 3, an air mover unit (e.g., air mover unit(s) (412)) may be removed from a modular processing unit (e.g., modular processing unit(s) (408)). In the embodiment depicted in FIG. 4, air mover unit(s) (412) are located on the rear side of the modular processing unit(s) (408), and therefore removal of the air mover unit(s) (412) requires access to the rear side of the modular processing unit(s) (408). Thus, in one embodiment of the invention, where the rear side of the modular compute chassis (404) is accessible, one or more air mover unit(s) (412) may be installed, removed, serviced, and/or replaced while one or more modular processing unit(s) (408) remain installed within the modular compute chassis (404). In one embodiment of the invention, installing, removing, servicing, and/or replacing an air mover unit (412) while the respective modular processing unit (408) remains powered by the modular compute chassis (404) may be referred to as "hot swapping" that air mover unit (412).

While FIG. 4 shows an example of a rear side modular compute chassis, other configurations may be used without departing from the scope of the invention. For example, although the modular compute chassis is shown with eight equally sized bays and eight equally sized modular processing units, a modular compute chassis may include any number of bays and/or bays of varying size to accommodate modular processing units of corresponding sizes. Accordingly, embodiments disclosed herein should not be limited to the configuration of devices and/or components shown in FIG. 4.

Figure 5:
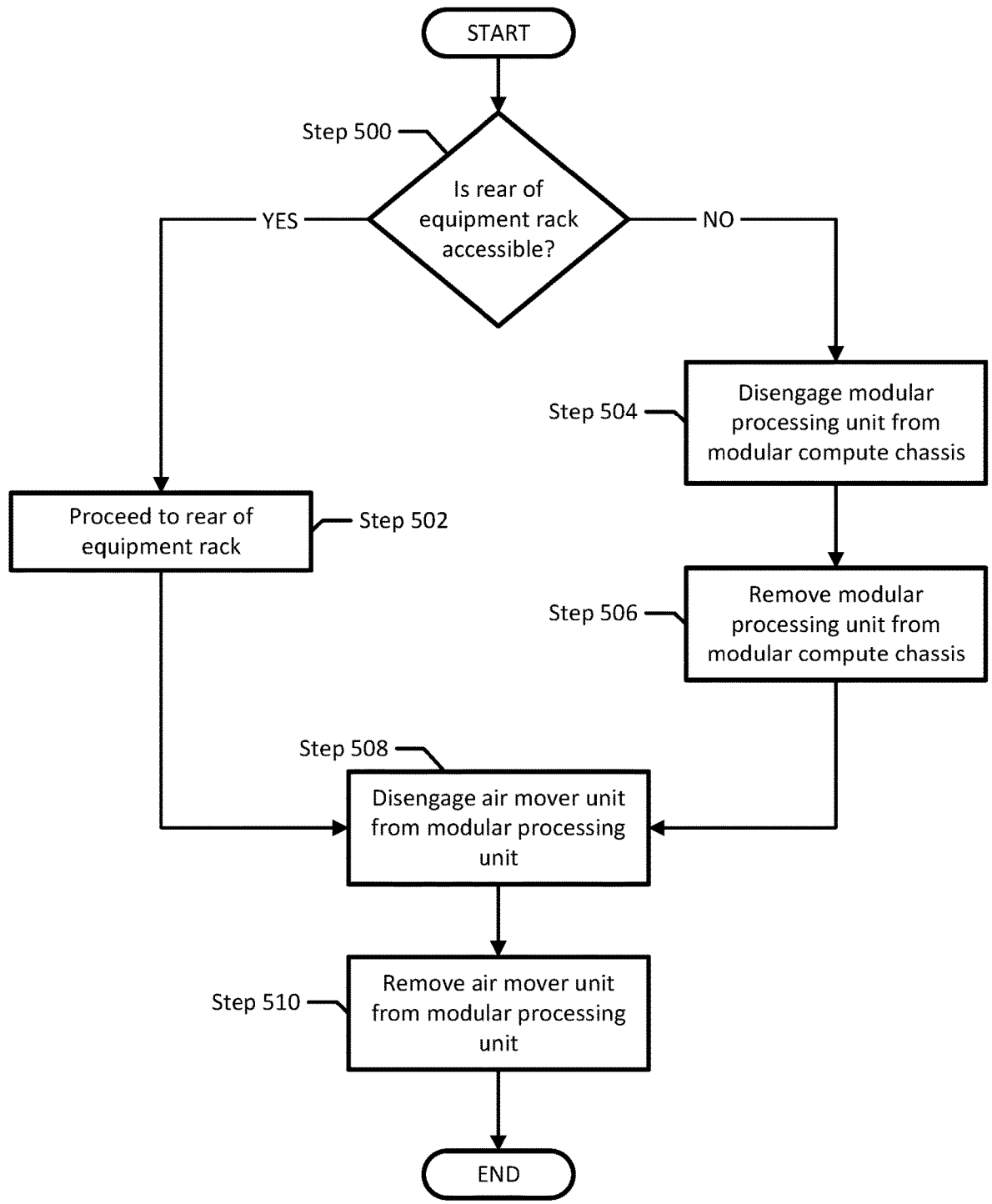
FIG. 5 shows a flowchart of a method of removing an air mover unit, in accordance with one or more embodiments of the invention.

FIG. 5 shows a flowchart of a method of removing an air mover unit, in accordance with one or more embodiments of the invention. All or a portion of the method shown in FIG. 5 may be performed by one or more users, clients, system administrators, and/or installers of a modular compute chassis and/or modular processing unit. However, another person may perform this method without departing from the invention. While the various steps in this flowchart are presented and described sequentially, one of ordinary skill in the relevant art will appreciate that some or all of the steps may be executed in different orders, may be combined or omitted, and some or all steps may be executed in parallel.

In Step 500, a determination is made as to whether the rear side of an equipment rack is accessible. In one embodiment of the invention, the rear side (e.g., back) of an equipment rack (and/or some portion thereof) may be disposed near and/or against an obstruction (e.g., surface, wall, cabling, etc.) and/or may not be otherwise accessible (e.g., disposed near and/or against an open but physically inaccessible area, an unsafe area, etc.) such that it may be difficult, if not impossible, to access the rear side of the equipment rack. Consequently, one or more component(s) disposed on the rear side of the equipment rack (e.g., modular compute chassis, modular processing unit(s), air mover unit(s), etc.) may therefore be inaccessible as well. Accordingly, if the rear of the equipment rack is not accessible and an air mover unit (located on the rear of modular compute chassis) is desired to be removed, some method of accessing the air mover unit from the front must be employed.

In one embodiment of the invention, and as used herein, an equipment rack being disposed "near" an obstruction means that the distance between the rear of the equipment rack and the obstruction is smaller than the distance needed to remove one or more component(s) from the rear side of the equipment rack. That is, the length of component (in the insertion/removal direction) plus some tolerance is larger than the length of the physical space behind that equipment rack.

In one or more embodiments of the invention, a rack may be considered "near" an obstruction if the space behind the equipment rack is not sufficiently large enough to allow a user to remove a component in an ideal and/or desired manner. For example, in an ideal circumstance (with ample open space behind the equipment rack), a user may remove a component from the rear of an equipment rack by standing directly behind the equipment rack and maneuvering themselves and the component freely in that open space. Thus, an equipment rack may be considered 'near' an obstruction if the user and/or component would have to be removed in a manner other than the ideal manner. Additionally, in one embodiment of the invention, an equipment rack may be considered 'near' an obstruction if it is not possible to remove the component in any fashion (i.e., the space is too small) regardless of the user's and/or component's physical maneuverings.

Accordingly, if the rear side of an equipment rack is accessible (500-YES), the process proceeds to Step 502. Alternatively, if the rear side of an equipment rack is not accessible (500-NO), the process proceeds to Step 504.

In Step 502, the servicer of one or more air mover unit(s) proceeds to the rear side of the equipment rack. In one or more embodiments of the invention, the rear side of the equipment rack may be accessible thereby providing access to one or more components (e.g., modular compute chassis, modular processing units, air mover units, etc.) disposed thereon. After the completion of Step 502, the method proceeds to Step 508.

In Step 504, the modular processing unit (on which the desired air mover unit is located) is accessed via the front of the equipment rack and disengaged from the modular compute chassis. In one embodiment of the invention, the modular processing unit may be disengaged by relieving one or more mechanical attachment device(s) (e.g., latch(es)) that prevent the independent movement of the modular processing unit from the modular compute chassis.

Alternatively, in one or more embodiments of the invention, the modular compute chassis and modular processing unit may lack a mechanical attachment device. Accordingly, in one embodiment of the invention, it may not be necessary to disengage the modular processing unit from the modular compute chassis.

In Step 506, the modular processing unit is removed from the modular compute chassis. The modular processing unit may be removed from the modular compute chassis by translating (e.g., sliding) the modular processing unit away from the modular compute chassis in a frontward direction (relative to the modular compute chassis). In one embodiment of the invention, the modular processing unit may be physically connected via one or more communication interfaces to other devices. Accordingly, to fully remove the modular processing unit from the modular compute chassis, one or more physical connection(s) may have to be removed (i.e., disconnected) to allow for the free movement of the modular processing unit from the modular compute chassis and/or equipment rack generally. After removal from the modular compute chassis, one or more air mover unit(s) disposed on the rear side of the modular processing unit becomes accessible.

In Step 508, the air mover unit is disengaged from the modular processing unit. In one embodiment of the invention, the air mover unit may be disengaged by relieving one or more mechanical attachment device(s) (e.g., latch(es)) that prevent the independent movement of the air mover unit from the modular processing unit.

Alternatively, in one or more embodiments of the invention, the modular processing unit and air mover unit may lack a mechanical attachment device. Accordingly, in one embodiment of the invention, it may not be necessary to disengage the air mover unit from the modular processing unit.

In Step 510, the air mover unit is removed from the modular processing unit. The air mover unit may be removed from the modular processing unit by translating (e.g., sliding) the air mover unit away from the modular processing unit in a rearward direction (relative to the modular processing unit). In one embodiment of the invention, the air mover unit may be physically connected via one or more communication interfaces to other devices. Accordingly, to fully remove the air mover unit from the modular processing unit, one or more physical connection(s) may have to be removed (i.e., disconnected) to allow for the free movement of the air mover unit from the modular processing unit, modular compute chassis, and/or equipment rack generally. After removal from the modular processing unit, one or more air mover unit(s) may be serviced, reinserted, and/or replaced with a different air mover unit.

While one or more embodiments have been described herein with respect to a limited number of embodiments and examples, one of ordinary skill in the art, having the benefit of this detailed description, would appreciate that other embodiments can be devised which do not depart from the scope of the embodiments disclosed herein. For example, although the figures, embodiments, and descriptions disclosed here refer to an air mover unit being the device which is installed, removed, serviced, and/or replaced, the same embodiments and process apply equally to other modular components. For example, instead of an air mover unit, a power supply would benefit equally from the systems and methods disclosed here. Other non-limiting examples of modular components include hot-swappable storage devices (e.g., using connection via universal serial bus (USB), serial advanced technology attachment (SATA), etc.), peripheral interfaces (e.g., small form-factor pluggable (SFP) transceivers), and/or other computing resources. Accordingly, the scope should be limited only by the attached claims.

What is claimed is:

1. An equipment rack, comprising:
   a modular compute chassis;
   a modular processing unit disposed in the modular compute chassis, wherein the modular processing unit is configured to be removed from a front side of the modular compute chassis in a frontward direction, relative to the front side of the modular compute chassis; and
   an air mover unit disposed in the modular processing unit, wherein the air mover unit is configured to be removed from a rear side of the modular processing unit in a rearward direction, relative to the front side of modular compute chassis, and the air mover unit can be removed without removing the modular processing unit from the modular compute chassis.

2. The equipment rack of claim 1, wherein a rear side of the equipment rack is disposed near an obstruction, wherein the rear side of the modular processing unit is disposed on the rear side of the equipment rack.

3. The equipment rack of claim 1, wherein the modular processing unit is operatively connected to a shared resource interface of the modular compute chassis.

4. The equipment rack of claim 3, wherein the shared resource interface is disposed on an interior of the modular compute chassis.

5. The equipment rack of claim 4, wherein the shared resource interface is configured to physically contact a rear communication interface of the modular processing unit.

6. The equipment rack of the claim 1, wherein a second modular processing unit is disposed in the modular compute chassis.

7. The equipment rack of claim 6, wherein the second modular processing unit is disposed horizontally adjacent to the modular processing unit.

8. The equipment rack of claim 7, wherein the equipment rack comprises a second modular compute chassis.

9. The equipment rack of claim 8, wherein the second modular compute chassis is disposed vertically adjacent to the modular compute chassis.

10. A method for removing an air mover unit, comprising: gaining access to a rear side of a modular processing unit, wherein the modular processing unit is disposed in a modular compute chassis, wherein the modular computer chassis is disposed in an equipment rack; disengaging the air mover unit from the modular processing unit without removing the modular processing unit from the modular compute chassis; and translating the air mover unit out of the modular processing unit, wherein the air mover unit is configured to remove from the rear side of the modular processing unit in a rearward direction, relative to a front side of modular compute chassis.

11. The method of claim 10, wherein gaining access to the rear side of the modular processing unit comprises:
   making a determination that the rear side of the modular processing unit is accessible; and
   proceeding to the rear side of the modular processing unit.

* * * * *